United States Patent
Orlowski et al.

[19]

[11] Patent Number: 5,985,736
[45] Date of Patent: Nov. 16, 1999

[54] PROCESS FOR FORMING FIELD ISOLATION

[75] Inventors: Marius K. Orlowski; Karl Wimmer, both of Austin, Tex.

[73] Assignee: Motorola, Inc., Schaumburg, Ill.

[21] Appl. No.: 08/949,825

[22] Filed: Oct. 14, 1997

Related U.S. Application Data

[60] Continuation of application No. 08/438,133, May 8, 1995, abandoned, which is a division of application No. 08/266,833, Jun. 28, 1994, Pat. No. 5,432,118.

[51] Int. Cl.⁶ .................................................. H01L 21/762
[52] U.S. Cl. ............................................. 438/445; 438/448
[58] Field of Search .................................. 438/445, 448, 438/FOR 229, FOR 230; 148/DIG. 85, DIG. 86, DIG. 117

[56] References Cited

U.S. PATENT DOCUMENTS

| | | | |
|---|---|---|---|
| 4,508,757 | 4/1985 | Fabricius et al. | 427/93 |
| 5,108,946 | 4/1992 | Zdebel et al. | 437/72 |
| 5,149,669 | 9/1992 | Hosaka . | |
| 5,248,350 | 9/1993 | Lee . | |
| 5,308,784 | 5/1994 | Kim et al. | 437/67 |

FOREIGN PATENT DOCUMENTS

| | | |
|---|---|---|
| 61-85838 | 5/1986 | Japan . |
| 62-14439 | 1/1987 | Japan . |
| 1-61928 | 3/1989 | Japan . |
| 1-187950 | 7/1989 | Japan . |
| 4-150030 | 5/1992 | Japan . |
| 4-150052 | 5/1992 | Japan . |
| 2 101 399 | 1/1983 | United Kingdom ............ H01L 21/94 |

OTHER PUBLICATIONS

Wolf, S., *Silicon Processing for the VLSI Era: vol. 2, Process Integration*, Lattice Press, 1990, p. 23.
Ghezzo, et al.; "Laterally Sealed LOCOS Isolation"; J. Electrochemical Society; Solid–State Science and Technology; pp. 1475–1479 (1987).
Chiu; "SWAMI: A Zero–Encroachment Local Oxidation Process"; Hewlett–Packard Journal; pp. 31–32 (1982).

*Primary Examiner*—George Fourson
*Attorney, Agent, or Firm*—George R. Meyer

[57] ABSTRACT

Field isolation regions are formed using oxidation-resistant spacers or plugs that completely fill trenches within a semiconductor substrate prior to forming the field isolation regions. The spacers or plugs help to reduce encroachment of the field isolation regions under the spacers or plugs. The structure used as an oxidation mask for the field isolation process may include a silicon-containing member that is thicker than an overlying oxidation-resistant member. The thicker silicon-containing member may be capable of tolerating higher stress before defects in an underlying pad layer or substrate are formed.

12 Claims, 5 Drawing Sheets

PROCESS FOR FORMING FIELD ISOLATION

This application is a continuation of prior patent application Ser. No. 08/438,133 filed on May 8, 1995, now abandoned, which is a division of prior patent application Ser. No. 08/266,833 filed on Jun. 28, 1994, now U.S. Pat. No. 5,432,118.

FIELD OF THE INVENTION

The present invention relates to processing semiconductor substrates, and in particular, to forming field isolation over semiconductor substrates.

BACKGROUND OF THE INVENTION

Commonly used field isolation processes include local oxidation of silicon (LOCOS) and poly-buffered LOCOS (PBL). A thermal oxidation step is performed to form field isolation regions. The thermal oxidation typically allows oxidizing species to diffuse along a pad oxide layer which results in a relatively large encroachment.

Two field isolation processes used to form field isolation with less encroachment include sidewall masked field isolation (SWAMI) and laterally sealed LOCOS. Both processes include forming a recess or trench within the substrate and forming a second nitride layer or nitride spacers. With nitride spacers, neither process completely fills the recess or trench. Therefore, these processes may still cause encroachment to be too large.

SUMMARY OF THE INVENTION

The present invention includes a process for forming field isolation comprising the steps of: forming an oxidation-resistant member over a semiconductor substrate; forming a first spacer adjacent to the oxidation-resistant member; forming a first layer over the substrate and adjacent to the first spacer; removing the first spacer; etching a trench into the substrate; removing first layer; forming a second spacer over the substrate, adjacent to the oxidation-resistant member, and within the trench to completely fill the trench; and thermally oxidizing the substrate to form a field isolation region. The first spacer has a base width and includes a material different from the oxidation-resistant member. The first layer includes a material different from both the oxidation-resistant member and the first spacer. The second spacer includes an oxidation-resistant material. The present invention may include forming oxidation-resistant plugs, as opposed to spacers.

The present invention also includes a process for forming field isolation comprising the steps of: forming a silicon-containing member over a semiconductor substrate; forming a first oxidation-resistant member over the silicon-containing member; and thermally oxidizing the substrate to form a field isolation region. The silicon-containing member has a first thickness, and the first oxidation-resistant member has a second thickness that is thinner than the first thickness.

The present invention further includes a process for forming field isolation comprising the steps of: forming an oxidation-resistant member over a semiconductor substrate having a primary surface; etching a trench into the substrate adjacent to the oxidation-resistant member; forming a spacer over the substrate and adjacent to the oxidation-resistant member; forming a silicon-containing layer on a portion of the substrate that is adjacent to the oxidation-resistant member; and thermally oxidizing the substrate to form a field isolation region. The spacer includes an oxidation-resistant material.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION OF EMBODIMENTS

Field isolation regions are formed using oxidation-resistant spacers or plugs that completely fill trenches within a semiconductor substrate prior to forming the field isolation regions. The spacers or plugs help to reduce encroachment of the field isolation regions under the spacers or plugs. The structure used as an oxidation mask for the field isolation process may include an oxidation resistant member that is thinner than an underlying silicon-containing member. The present invention is better understood by the embodiments that are described below.

Field Isolation Formed With Spacers Over the Substrate

Figure 1:
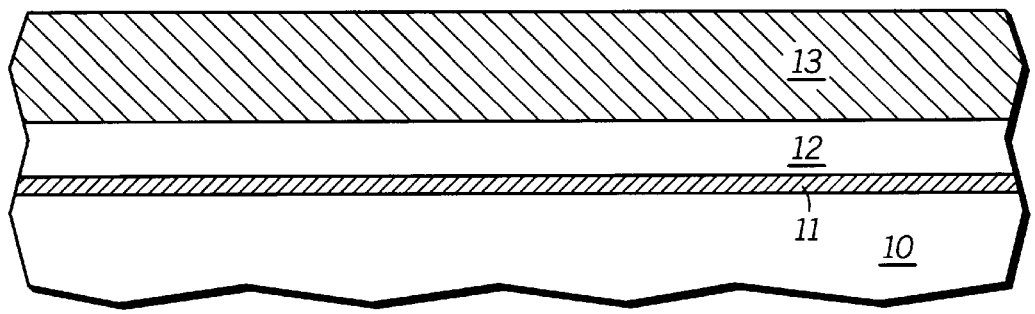
FIG. 1 includes an illustration of a cross-sectional view of a portion of a semiconductor substrate with layers overlying the substrate.
Figure 2:
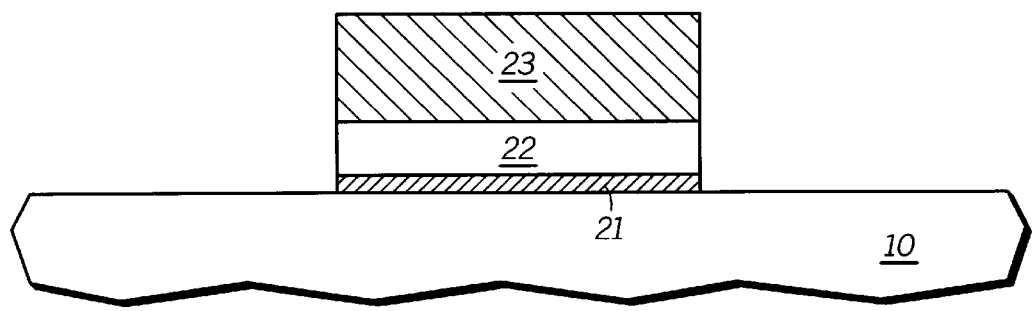
FIG. 2 includes an illustration of a cross-sectional view of the substrate of FIG. 1 after patterning the layers overlying the substrate.

FIG. 1 includes a cross-sectional view of a portion of a semiconductor substrate 10. A pad layer 11, a silicon-containing layer 12, and an oxidation-resistant layer 13 overlie the primary surface of the substrate 10. The pad layer 11 typically includes silicon dioxide and has a thickness in a range of about 70–200 angstroms thick. In alternative embodiments, the pad layer may include a nitrided oxide. The silicon-containing layer 12 typically includes polysilicon or amorphous silicon and has a thickness in a range of about 500–600 angstroms. The oxidation-resistant layer 13 typically includes silicon nitride and has a thickness in a range of about 1000–2100 angstroms. The three layers 11–13 are patterned to form a pad member 21, a silicon-containing member 22, and an oxidation-resistant member 23 as shown in FIG. 2.

Figure 3:
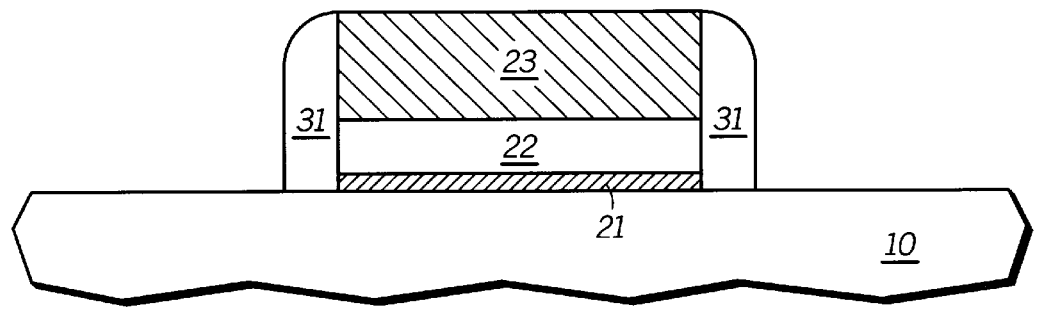
FIG. 3 includes an illustration of a cross-sectional view of the substrate of FIG. 2 after forming a first set of spacers.

A first set of spacers 31 are formed adjacent to the pad, silicon-containing, and oxidation-resistant members 21–23 as shown in FIG. 3. The spacers are formed by depositing a layer and anisotropically etching the layer. The layer for the spacers is deposited to a thickness in a range of about 500–1000 angstroms and may include a material, such as silicon-germanium. In alternative embodiments, the material used for the layer adjacent to the members may include any other type of material, as long as, the material used for the spacers 31 can be removed selectively to the substrate 10 and the member 23. The width of the spacers 31 at their bases is typically determined by the thickness of the layer from which the spacers 31 are formed. In alternate embodiments, the layer to form the spacers 31 may actually be thinner than 500 angstroms or thicker than 1000 angstroms. As far as is known, there is no lower limit for width of the spacers at their bases. With respect to an upper limit, there is no known upper limit. Still, if the spacers 31 are to wide, the spacers 31 may become to close for adjacent oxide silicon nitride stacks. If the stacks are too close, a subsequently formed field isolation region may be thinner compared to areas where the stacks are spaced further apart.

In an alternate embodiment, the pad layer 11 may not be patterned when the silicon-containing member 22 and oxidation-resistant member 23 are formed. In other words, the pad layer 11 overlies the entire substrate 10. In this embodiment, silicon (rather than silicon-germanium) may be used for the spacers 31 because the pad layer 11 protects the substrate 10 during the etch to form the spacers 31.

Figure 4:
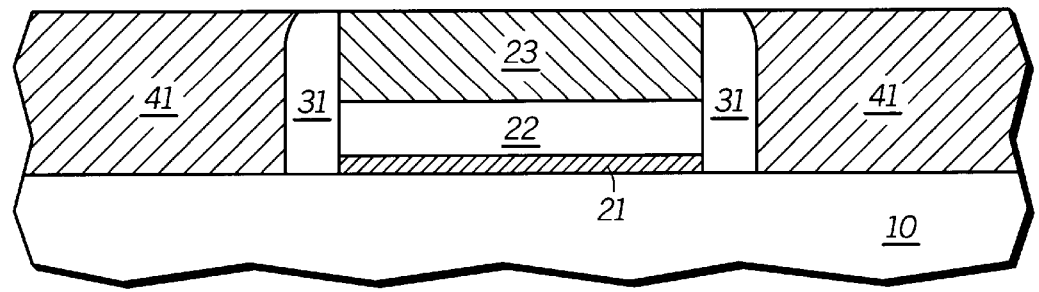
FIG. 4 includes an illustration of a cross-sectional view of the substrate of FIG. 3 after forming an insulating layer adjacent to the first set of spacers.

An insulating layer 41 is formed over the substrate 10 and adjacent to the spacers 31 as shown in FIG. 4. The insulating layer 41 may be formed by depositing a silicon dioxide over the substrate 10 and polishing the silicon dioxide to expose portions of the spacers 31 and the oxidation-resistant member 23. In an alternate embodiment, the insulating layer 41 may be formed by depositing borophosphosilicate glass (BPSG) over the substrate 10 and reflowing the BPSG and partially etching back the BPSG to expose portions of the spacers 31 and the oxidation-resistant member 23. In this alternate embodiment, the pad oxide layer 11 may need to be present over the substrate 10 to help reduce the chances of doping the substrate 10 from the BPSG during the reflow step. The insulating layer 41 may includes other materials, but those materials should etch at a different rate compared to the spacers 31 and member 23.

Figure 5:
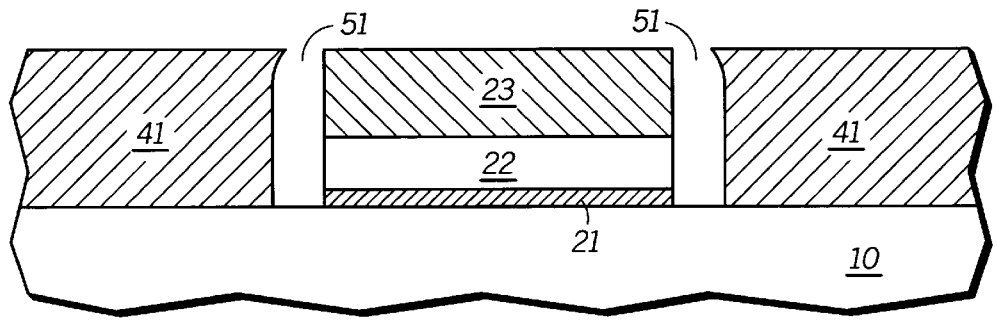
FIG. 5 includes an illustration of a cross-sectional view of the substrate of FIG. 4 after removing the first set of spacers.
Figure 6:
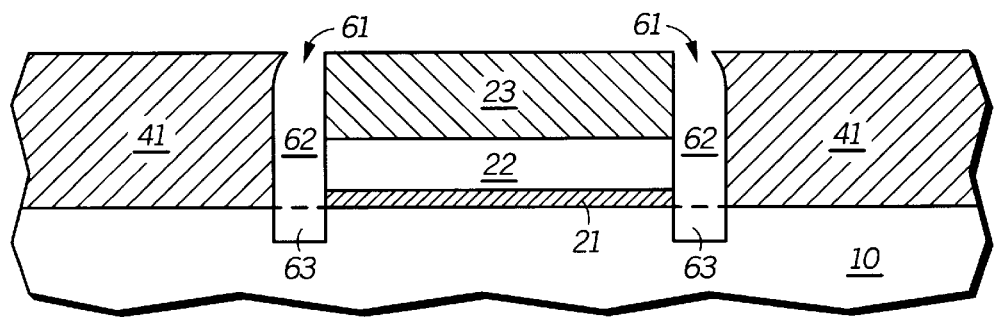
FIG. 6 includes an illustration of a cross-sectional view of the substrate of FIG. 5 after forming trenches within the substrate.

The first set of spacers 31 are then removed. Openings 51 are formed where the spacers 31 were located as shown in FIG. 5. After forming the openings 51, an etch is performed to form openings 61 as shown in FIG. 6. Openings 61 actually include portions 62 and 63. The portion 62 generally corresponds to the openings 51 in FIG. 5. The portions 63 are actually recesses or trenches that are formed within the substrate 10. The portions 63 are formed using an anisotropic etch. The depth of the portions 63 typically are in a range of 500–1000 angstroms, although deeper or shallower trenches may be formed. The width of the portions 63 are no wider than the widths of the bases of the spacers 31.

Figure 7:
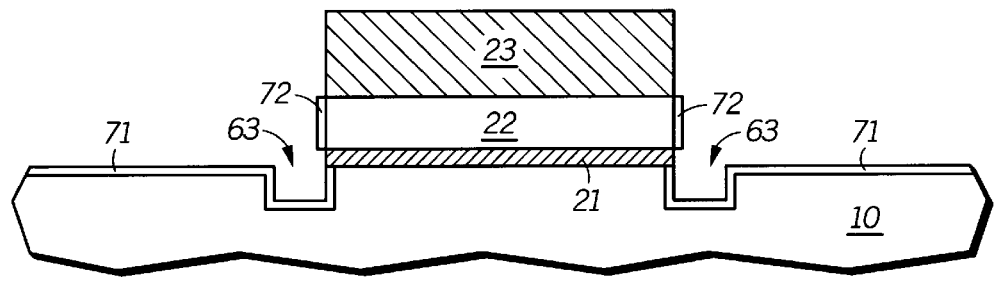
FIG. 7 includes an illustration of a cross-sectional view of the substrate of FIG. 6 after removing the insulating layer.

The insulating layer 41 is then removed, and the exposed silicon surfaces are oxidized using a short thermal oxidation cycle. The thermal oxidation cycle forms oxide layers 71 and 72 as shown in FIG. 7. Oxide layers 71 typically have a thickness in a range of about 30–70 angstroms, and oxide layers 72 are formed from portions of the silicon-containing member 22 that are exposed during the thermal oxidation step. The oxide layers 71 act as adhesion layers between the substrate 10 and subsequently formed spacers.

Figure 8:
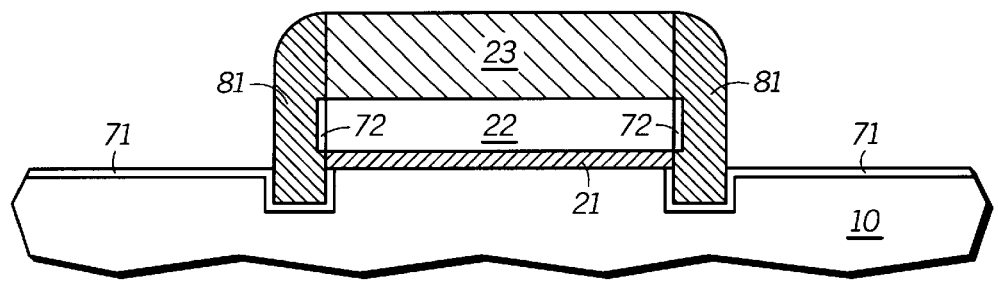
FIG. 8 includes an illustration of a cross-sectional view of the substrate of FIG. 7 after forming a second set of spacers.

A second set of spacers 81 are then formed adjacent to the members 22 and 23 as shown in FIG. 8. The spacers 81 include an oxidation-resistant material, such as silicon nitride and the like. The material is deposited to a thickness sufficient to completely fill the portions 63 of the openings 61. Typically, this layer is deposited to a thickness in a range of 500–1000 angstroms and is then anisotropically etched to form the spacers 81. Although some of the oxidation-resistant member 23 may be etched during the formation of the spacers 81, a sufficient thickness of member 23 remains to act as an oxidation barrier. Member 23 should have a thickness no less than 500 angstroms following the formation of the spacers 81. Although member 23 and spacers 81 may include silicon nitride, member 23 and spacers 81 may include different materials.

Figure 9:
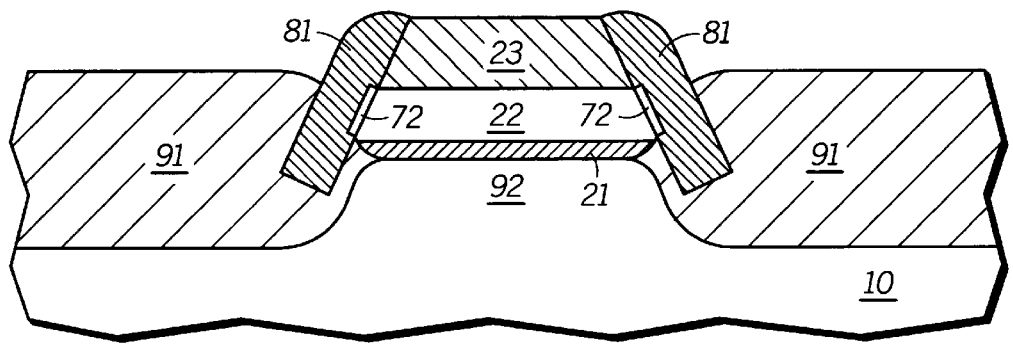
FIG. 9 includes an illustration of a cross-sectional view of the substrate of FIG. 8 after forming field isolation regions.

Field isolation regions 91 are formed adjacent to the oxidation-resistant spacers 81 and the members 22 and 23 as shown in FIG. 9. The field isolation regions 91 are formed by a thermal oxidation step that typically is performed at a temperature in a range of about 800–1100 degree Celsius using an ambient that includes steam. In alternate embodiments, even higher or lower temperatures may be used, or other oxidation species may be used. Further, the oxidation step may be performed using high pressure steam or oxygen, such as in the range of 5–20 atmospheres. The field isolation regions 91 define the active region 92 within the substrate 10.

Figure 10:
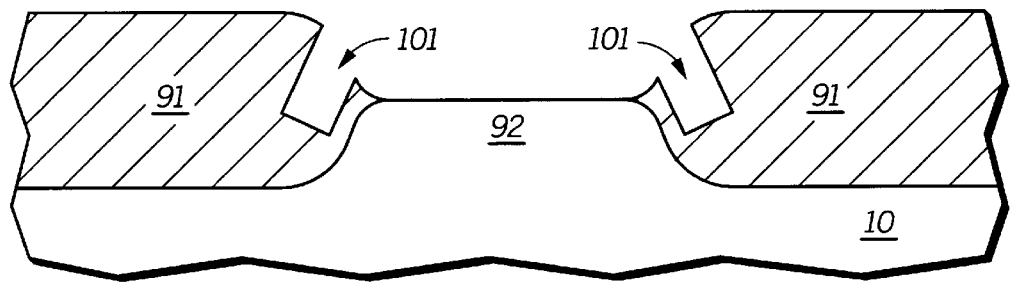
FIG. 10 includes an illustration of a cross-sectional view of the substrate of FIG. 9 after removing the second set of spacers.
Figure 11:
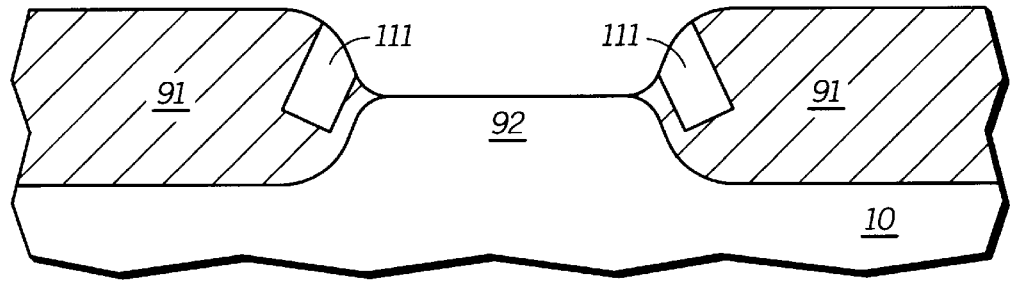
FIG. 11 includes an illustration of a cross-sectional view of the substrate of FIG. 10 after filling gaps in the field isolation regions.

After forming the field isolation regions 91, the spacers 81, oxide layers 72, and members 21–23 are removed as shown in FIG. 10. The removal of the spacers 81 forms gaps 101 in the field isolation regions 91. Typically, the gaps 101 are filled to form plugs 111 as shown in FIG. 11. For example, a silicon dioxide layer may be conformally deposited over the field isolation regions 91 and within the gaps 101 and then etched to exposed the active region 92 within the substrate 10. Alternatively, the gaps may be partially or completely filled with polysilicon and then thermally oxidized to convert the polysilicon into silicon dioxide. Any remaining silicon dioxide over the active region 92 is removed as shown in FIG. 11. After this point in the process sequence, active components may now be formed within the active region between the field isolation regions 91. Formation of active devices is conventional and well known to those skilled in the art.

Field Isolation Formed With Plugs Over the Substrate

Figure 12:
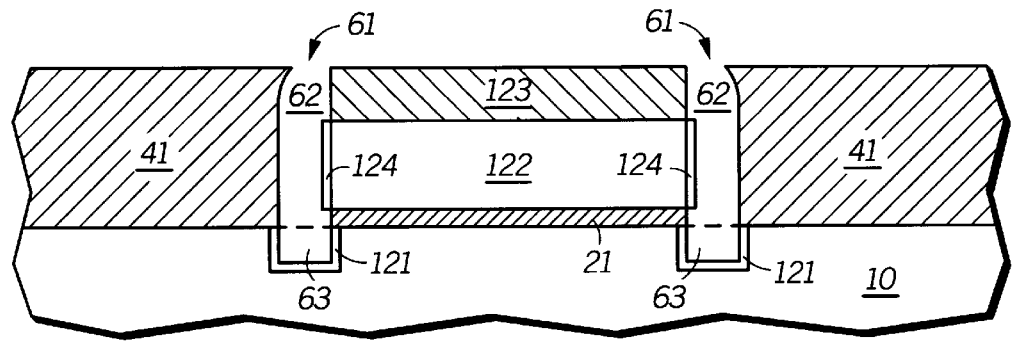
FIG. 12 includes an illustration of a cross-sectional view of a portion of a semiconductor substrate after forming oxide regions within openings.

In another embodiment spacers 81 may be replaced with plugs. The process sequence is similar to the prior embodiment but does have some differences. FIG. 12 has a structure that is similar to FIG. 6. The process steps used to form the structure of FIG. 12 are similar to those steps leading up to the formation of FIG. 6. Unlike FIG. 6, the silicon-containing member 122 is thicker than the oxidation-resistant member 123. More specifically, the silicon-containing member 122 typically has a thickness in a range of about 1.5–7.0 times thicker than the oxidation-resistant member 123. For example, the silicon-containing member 122 may have a thickness in a range of about 750–2000 angstroms, and the oxidation-resistant member 123 may have a thickness in a range of about 700–1500 angstroms. In any event, the silicon-containing member 122 is thicker than the oxidation-resistant member 123. Note that the previous embodiment having the oxidation-resistant spacers 81 may also have a silicon-containing member 22 that is thicker than its overlying oxidation-resistant member 23.

Figure 13:
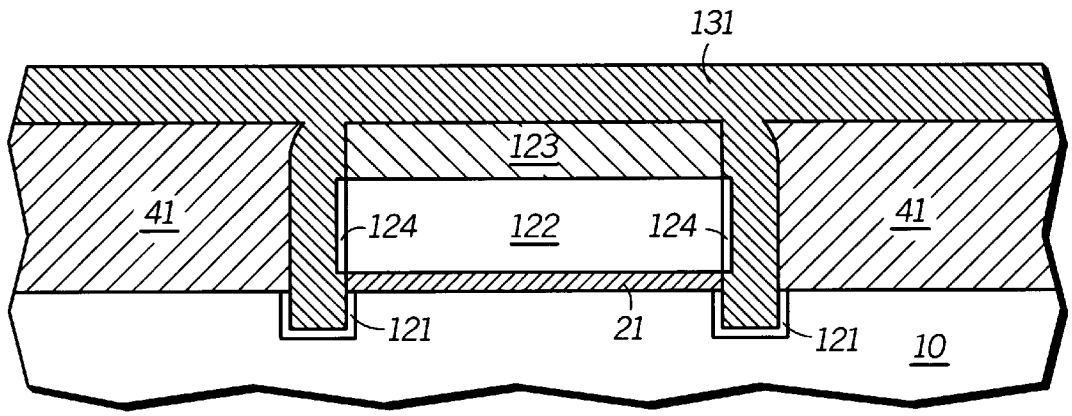
FIG. 13 includes an illustration of a cross-sectional view of the substrate of FIG. 12 after forming an oxidation-resistant layer within openings and over the insulating layer.

A short thermal oxidation cycle is performed to oxidize exposed surfaces of the substrate 10 and silicon-containing member 122 to form oxide layers 121 and 124 as shown in FIG. 12. Oxide layers 121 lie adjacent to portions 63 of the openings 61 and typically have a thickness in a range of 30–70 angstroms. The oxide layers 121 act as adhesion layers between the substrate 10 and subsequently formed plugs. An oxidation-resistant layer 131 is formed within the openings 61, overlying the insulating layer 41, and overlying the oxidation-resistant member 123 as shown in FIG. 13. Typically, the oxidation-resistant layer 131 includes silicon nitride and has a thickness in a range of 500–1000 angstroms thick.

Figure 14:
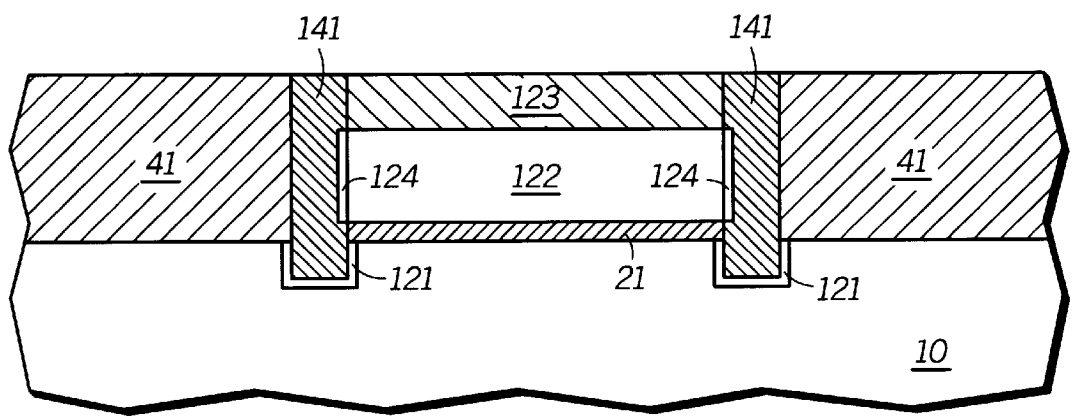
FIG. 14 includes an illustration of a cross-sectional view of the substrate of FIG. 13 after removing portions of the oxidation-resistant layer that overlie the insulating layer.

The portions of the oxidation-resistant layer 131 that overlie the insulating layer 41 and oxidation-resistant member 123 are then etched to expose portions of the insulating layer 41 and oxidation-resistant member 123. This step forms oxidation-resistant plugs 141 as shown in FIG. 14. Alternatively, the oxidation resistant layer 131 may have been polished to form the plugs 141. Although some of the oxidation-resistant member 123 may be removed during the formation of the plugs 141, a sufficient thickness of member 123 remains to act as an oxidation barrier. Member 123 should have a thickness no less than 500 angstroms following the formation of the plugs 141. Although member 123 and plugs 141 include silicon nitride, member 123 and plugs 141 may include different materials.

Figure 15:
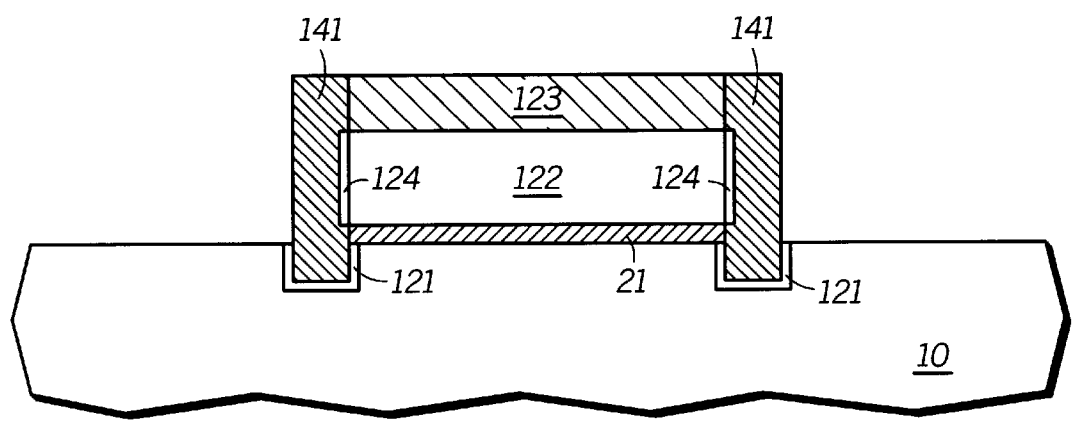
FIG. 15 includes an illustration of a cross-sectional view of the substrate of FIG. 14 after removing the insulating layer.

The insulating layer 41 is then removed to expose the substrate as shown in FIG. 15. This structure is then thermally oxidized with steps similar to those used in the previous embodiment.

Field Isolation Formed With Selective Epitaxy or Deposition

Figure 16:
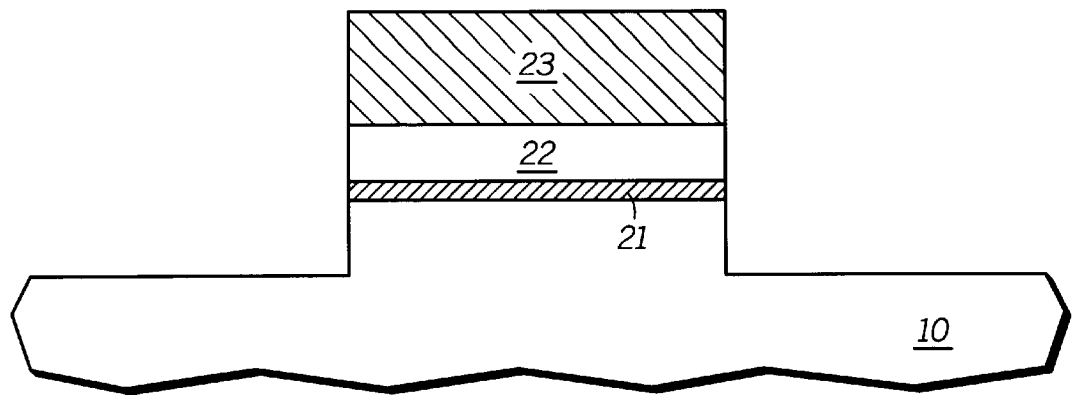
FIG. 16 includes an illustration of a cross-sectional view of the substrate of FIG. 2 after etching the substrate.
Figure 17:
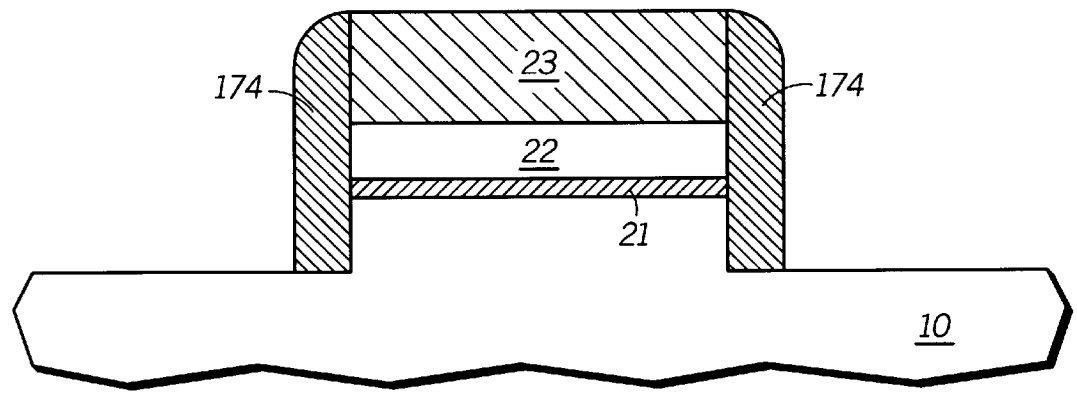
FIG. 17 includes an illustration of a cross-sectional view of the substrate of FIG. 16 after forming spacers.

In yet another embodiment, field isolation may be formed using a selective epitaxy or deposition process. The process starts with the structure as shown in FIG. 2. At this point in the process, the structure includes the pad, silicon-containing, and oxidation-resistant members 21–23, and the substrate 10 has a primary surface that lies at a first elevation. After forming the structure, the substrate 10 adjacent to the sides of the structure is etched about 500–1000 angstroms deep as shown in FIG. 16. The etch may be performed anisotropically as shown in FIG. 16 or isotropically (not shown). Oxidation-resistant spacers 174 are formed adjacent to the sides of the structure as shown in FIG. 17. The oxidation-resistant spacers 174 may be formed by depositing a silicon nitride layer and anisotropically etching the silicon nitride layer. If the etch of the substrate 10 is performed isotropically, a portion of the oxidation-resistant spacers are formed where a portion of the silicon-containing member 22 and substrate 10 were etched away.

Figure 18:
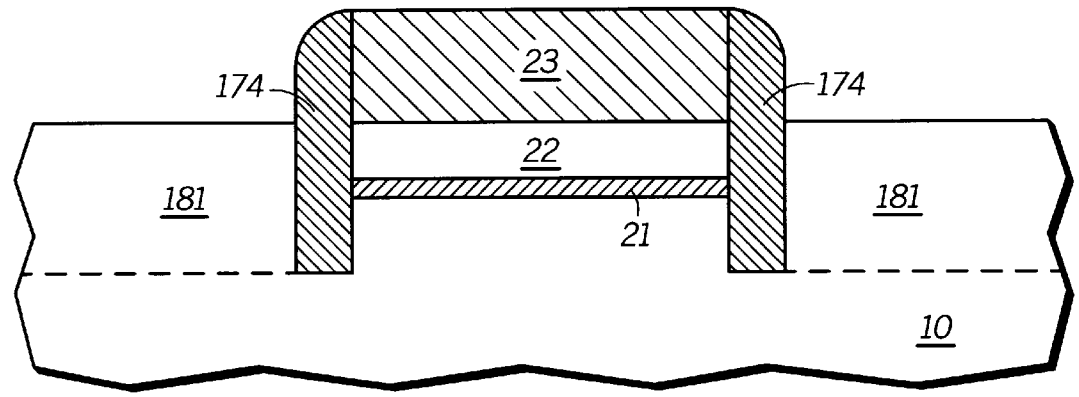
FIG. 18 includes an illustration of a cross-sectional view of the substrate of FIG. 17 after selectively forming a silicon-containing layer over exposed portions of the substrate.

A selective epitaxy or deposition step is performed to form a silicon-containing layer 181 over the exposed portions of the substrate 10 but not over the oxidation-resistant member or spacers 23 or 174. If the step is performed by selective epitaxial growth, the substrate 10 and silicon-containing layer 181 will have a monocrystalline structure. The step may also be performed to selectively deposit amorphous silicon, polycrystalline silicon (polysilicon), or porous silicon. Although selective-epitaxy may give lower leakage current near the subsequently formed field isolation region edges, most, if not all, of the layer 181 will become oxidized during a subsequent thermal oxidation step that forms the field isolation regions. If all of the silicon-containing layer 181 is converted to oxide, the choice of using a selective epitaxy or a selective deposition may be inconsequential. If amorphous silicon is selectively deposited, the amorphous silicon may or may not be subsequently crystallized. The silicon-containing layer 181 is formed to a thickness such that the layer 181 has an exposed surface that generally lies at a second elevation that is no lower than the first elevation (primary surface) of the primary surface of the substrate. As shown in FIG. 18, the surface of layer 181 lies at an elevation about the same as the elevation of the interface between the silicon-containing and oxidation-resistant members 22 and 23. In many applications, layer 181 has a thickness in a range of about 500–2000 angstroms thick.

After forming the layer 181, field isolation regions are formed similar to the previously described embodiments. After removing the oxidation-resistant member and spacers 23 and 174, gaps within the field isolation regions are filled similar to the previously described embodiments.

In an alternate embodiment for the selective epitaxy or deposition process sequence, thin oxide layers similar to oxide layer 71 and 72 may have been formed before the oxidation-resistant spacers 174 is formed. After forming the oxidation-resistant spacers 174, the exposed portions of the oxide layers that lie on the substrate 10 is removed prior to the selective epitaxy or deposition step. The thin oxide layer would underlie the oxidation-resistant members 174 but would not extend beyond the edges of the spacers 174. In still another alternate embodiment, the silicon-containing member 22 may be thicker than the oxidation-resistant member 23 similar to the silicon-containing and oxidation-resistant members 122 and 123 that have been previously described.

Benefits

The present invention includes many benefits. The oxidation-resistant spacers 81 or plugs 141 completely fill portions 63 of the openings 61 prior to forming the field isolation regions 91. The substrate surface underlying the pad layer is at substantially the same elevation as the surface of the substrate 10 at other regions further from the pad member 21 on the other side of the oxidation-resistant spacers or plugs. A longer oxidation time is needed to oxidize under the plugs or spacers compared to a process where spacers are only formed along the sides of a substrate trench (i.e., where spacers do not completely fill the trench). Therefore, the structure of the embodiments described above are expected to have a less encroachment beneath the pad member 21. The embodiments previously described have a potential of zero encroachment.

Another benefit of the present invention is that the oxide layers 71 and 121 may allow limited diffusion of oxidizing species during the thermal oxidation cycle that forms the field isolation regions 91. The limited diffusion helps to round the corners of the substrate 10 under the pad member 21 and adjacent the spacers 81 or plugs 141. The substrate rounding should reduce the chances of forming points of unusually high field in active components formed over the active region 92. Also, the oxide layers 71 and 121 help to keep the oxidation-resistant spacers 81 or plugs 141 from popping off the wafer during the field oxidization step. More specifically, if oxide layers 71 or 121 were not present, the spacers 81 or plugs 141 may be more susceptible to pop off the substrate 10 due to the tensile stress and lower adherence to the underlying substrate 10. Still in alternate embodiments, the oxide layers 71 or 121 are not required.

Yet another benefit of the present invention is that the processes of the embodiments may be performed without the development of any unique or new processing steps. Therefore, the process may be integrated into an existing process flow and yet requires only one masking layer during the field isolation processing sequence. In other words, additional masks and masking steps are not required.

A further benefit is a reduced chance of forming defects within the pad member 21 or substrate 10 during the thermal cycle that forms the field isolation regions. A conventional PBL process may have a polysilicon member of about 550 angstroms thick and a silicon nitride member of about 1500 angstroms. Defects may form in the substrate during a thermal oxidation cycle that forms the field isolation regions. These substrate defects are typically in a form of edge dislocations. When the polysilicon member 550 is removed, any defects in an underlying pad member allow the polysilicon etchant to reach the substrate and cause substrate pits. The use of a silicon-containing member 122 that is thicker than the oxidation-resistant member 123 may be able to tolerate more stress and may reduce the chances of forming defects within the substrate 10 or the pad member 21. Although the silicon-containing member 122 is thicker, substrate pits are less likely to form if the pad member 21 has no defects.

In the foregoing specification, the invention has been described with reference to specific embodiments thereof. However, it will be evident that various modifications and changes can be made thereto without departing from the broader spirit or scope of the invention as set forth in the appended claims. Accordingly, the specification and drawings are to be regarded in an illustrative rather than a restrictive sense.

What is claimed is:

1. A process for forming field isolation comprising the steps of:

forming a silicon layer over a semiconductor;

forming a first oxidation-resistant layer over the silicon layer;

patterning the silicon layer and the first oxidation-resistant layer to form a silicon member and a first oxidation-resistant member that overlie the substrate;

etching a trench into the substrate after the step of patterning, wherein the trench lies adjacent to a side of the silicon member and the first oxidation resistant member forming a second oxidation-resistant layer over the first oxidation-resistant member and within the trench;

etching the second oxidation-resistant layer to form a second oxidation-resistant member that substantially fills the trench; and thermally oxidizing a resulting exposed portion of the substrate to form a field isolation region, wherein the step of thermally oxidizing is performed after forming the second oxidation-resistant member but before forming any other layer over any portion of the substrate.

2. The process of claim 1, further comprising a step of forming a pad layer prior to the step of forming the silicon layer.

3. The process of claim 1, wherein a thickness of the silicon layer is in a range of 1.5–7.0 times thicker than a thickness of the first oxidation-resistant layer.

4. The process of claim 1, wherein the step of thermally oxidizing is performed at a temperature in a range of about 800–1100 degrees Celsius with an ambient including steam.

5. The process of claim 1, further comprising steps of:

removing the first oxidation-resistant member, silicon member, and second oxidation-resistant member after the step of thermally oxidizing;

depositing an oxide layer over the field isolation region; and etching at least a portion of the oxide layer to expose a portion of the substrate.

6. The process of claim 1, wherein:

a thickness of the silicon layer is no greater than 600 angstroms; and the silicon layer is thicker than the first oxidation-resistant layer.

7. The process of claim 1, wherein after the step of etching the trench and before the step of forming the second-oxidation resistant layer:

the substrate has a first portion and a second portion;

the first portion lies at one side of the trench and is covered by the silicon member and the first oxidation-resistant member; and the second portion lies at an opposite side of the trench and at an elevation no lower than the first portion.

8. The process of claim 1, further comprising a step of forming an oxide layer between the steps of etching the trench and etching the second oxidation-resistant layer, wherein, after the step of etching the second oxidation-resistant layer, the trench is completely filled by a combination of the oxide layer and the second oxidation-resistant member.

9. The process of claim 1, wherein:

the step of etching the trench forms the trench with sides and a bottom; and the step of etching the second oxidation-resistant layer forms the second oxidation-resistant member that lies within about 70 angstroms of all the sides and bottom of the trench.

10. The process of claim 1, further comprising steps of:

forming a first spacer adjacent the silicon member and the first oxidation-resistant member;

forming a patterning layer adjacent over the silicon member, the first oxidation-resistant member, and the first spacer;

removing portions of the patterning layer to form a patterning member that overlies part but not all of the first spacer, wherein this step is performed before the step of etching the trench;

removing the first spacer after the step of the removing portions of the patterning layer before the step of etching the trench; and removing the patterning member after the step of etching the trench and before the step of thermally oxidizing.

11. The process of claim 10, wherein:

the step of removing the patterning member is performed between the steps of etching the trench and forming the second oxidation-resistant layer; and the step of etching the second oxidation-resistant layer forms the second oxidation-resistant member that is an oxidation-resistant spacer.

12. The process of claim 10, wherein:

the step of etching the second oxidation-resistant layer forms the second oxidation-resistant member that is an oxidation-resistant plug; and the step of removing the patterning member is performed after the step of etching the second oxidation-resistant layer.

* * * * *